US008645877B2

(12) United States Patent
Hsu et al.

(10) Patent No.: US 8,645,877 B2
(45) Date of Patent: Feb. 4, 2014

(54) MULTI-PATTERNING METHOD

(71) Applicant: Taiwan Semiconductor Manufacturing Co., Ltd., Hsin-Chu (TW)

(72) Inventors: Chin-Chang Hsu, Banqiao (TW); Ying-Yu Shen, Chiayi (TW); Wen-Ju Yang, Hsinchu (TW); Hsiao-Shu Chao, Baoshan Township (TW); Yi-Kan Cheng, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/902,102

(22) Filed: May 24, 2013

(65) Prior Publication Data

US 2013/0254726 A1 Sep. 26, 2013

Related U.S. Application Data

(63) Continuation of application No. 13/224,486, filed on Sep. 2, 2011, now Pat. No. 8,473,873.

(51) Int. Cl.
*G06F 17/50* (2006.01)

(52) U.S. Cl.
USPC .............................................. 716/52; 716/51

(58) Field of Classification Search
USPC ...................................................... 716/51, 52
See application file for complete search history.

(56) References Cited

U.S. PATENT DOCUMENTS

| 7,531,449 | B2 | 5/2009 | Park et al. |
| 7,879,727 | B2 | 2/2011 | Postnikov et al. |
| 7,906,253 | B2 | 3/2011 | Aton et al. |
| 2003/0159120 | A1* | 8/2003 | Baader et al. ............... 716/5 |
| 2009/0068843 | A1 | 3/2009 | Yang |
| 2009/0087619 | A1 | 4/2009 | Aton et al. |
| 2009/0125866 | A1 | 5/2009 | Wang et al. |
| 2010/0176479 | A1 | 7/2010 | Postnikov et al. |
| 2011/0023002 | A1 | 1/2011 | Cheng et al. |
| 2011/0193234 | A1 | 8/2011 | Chen et al. |
| 2013/0174106 | A1* | 7/2013 | Hsu et al. ................. 716/55 |

OTHER PUBLICATIONS

"Tachyon™ DDL & Tachyon™ DPT—A Comprehensive Low-K1 Computational Lithography Solution", 2008, Brion Technologies, Inc., 4 pages.

(Continued)

*Primary Examiner* — Suresh Memula
(74) *Attorney, Agent, or Firm* — Duane Morris LLP; Steven E. Koffs

(57) ABSTRACT

A method includes receiving data representing a layout of a DPT-layer of an integrated circuit generated by a place and route tool. The layout includes a plurality of polygons to be formed in the DPT-layer by a multi-patterning process. First and second ones of the plurality of polygons to be formed using first and second photomasks, respectively are identified. Any intervening polygons along a first path connecting the first polygon to the second polygon, and separator regions between adjacent polygons along the first path are identified. The separator regions have sizes less than a minimum threshold distance between polygons formed on the first photomask. The separator regions are counted. A multi-patterning conflict is identified, if the count of separator regions is even, prior to assigning all remaining ones of the plurality of polygons to the first or second masks.

20 Claims, 6 Drawing Sheets

(56) References Cited

OTHER PUBLICATIONS

Cho, M. et al., Double Patterning Technology Friendly Detailed Routing, IEEE/ACM International Conference on Computer-Aided Design, Nov. 2008, pp. 506-511.

Kruif, R. et al., "Wafer Based Mask Characterization for Double Patterning Lithography", 24th European Mask and Lilthography Conference, Jan. 2008, pp. 71-82.

Bubke, K. et al., "Mask Characterization for Double Patterning Lithography", Journal of Micro/Nanolithography, MEMS and MOEMS, Jan. 2009, 10 pages.

Mitra, et al., "RADAR: RET-Aware Detailed Routing Using Fast Lithography Simulations", Proceedings of the 42nd Design Automation Conference, Jun. 2005, pp. 369-372.

* cited by examiner

MULTI-PATTERNING METHOD

This application is a continuation of U.S. patent application Ser. No. 13/224,486, filed Sep. 2, 2011, which is incorporated by reference herein in its entirety.

FIELD

The present disclosure relates to semiconductor fabrication generally and more specifically to multi-patterning, such as double patterning.

BACKGROUND

In semiconductor fabrication processes, the resolution of a photoresist pattern begins to blur at about 45 nanometer (nm) half pitch. To continue to use fabrication equipment purchased for larger technology nodes, double exposure methods have been developed.

Double exposure involves forming patterns on a single layer of a substrate using two different masks in succession. As a result, a minimum line spacing in the combined pattern can be reduced while maintaining good resolution. In a method referred to as double dipole lithography (DDL), the patterns to be formed on the layer are decomposed and formed on a first mask having only horizontal lines, and on a second mask having only vertical lines. The first and second masks are said to have 1-dimensional (1-D) patterns, which can be printed with existing lithographic tools.

Another form of double exposure is referred to as double patterning technology (DPT). Unlike the 1-D approach of DDL, DPT in some cases allows a vertex (angle) to be formed of a vertical segment and a horizontal segment on the same mask. Thus, DPT generally allows for greater reduction in overall IC layout than DDL does. DPT is a layout splitting method analogous to a two coloring problem for layout splitting in graph theory. The layout polygon and critical space are similar to the vertex and edge of the graph respectively. Two adjacent vertices connected with an edge should be assigned different colors. If only two masks are to be used, then only two "color types" are assigned. Each pattern on the layer is assigned a first or second "color"; the patterns of the first color are formed by a first mask, and the patterns of the second color are formed by a second mask. A graph is 2-colorable only if it contains no odd-loop.

In terms of graph theory, when the total number of relationships between patterns that violate the minimum threshold spacing for a single mask (referred to as the separator distance) is odd, an odd loop is present, and DPT cannot be used without changing the layout.

If two features are so close that a high resolution exposure cannot be obtained by DDL or DPT decomposition, the pattern is said to have a "native conflict". Such a problem can be addressed by changing the layer design.

Improved methods for double patterning and other multi-patterning design flow are desired.

DETAILED DESCRIPTION

Figure 1A:
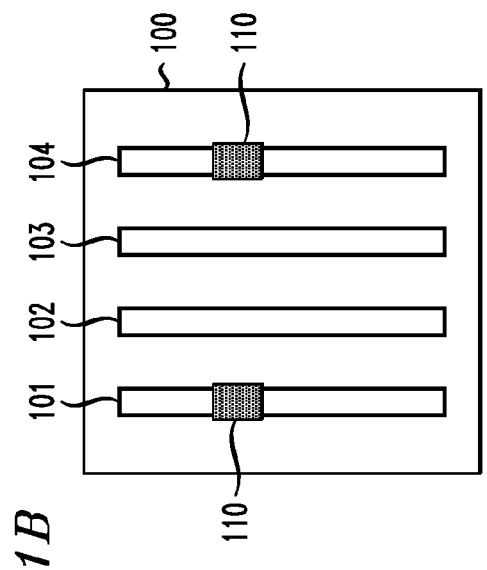
FIG. 1A is a schematic diagram of a layout of a metal layer with pre-coloring markers.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Designers and/or foundry personnel (collectively referred to below as a "user") may find it desirable to pre-assign or pre-color one or more groups of patterns (referred to collectively as polygons) on a metal layer of an interconnect structure. The pre-colored patterns within a given group are all formed by the same photomask. For example, in an SRAM the designer may choose to pre-color the bit line polygons on one mask and then the word line polygons on another mask. If a single metal layer is decomposed into N masks for multi-patterning (where N is an integer greater than one), then there are N colors available. That is, the number of colors available for pre-coloring does not exceed the number of photomasks used to pattern the one metal layer.

For example, following the completion of the place and route steps using an electronic design automation (EDA) tool, the user views the layout on a display of a computer system, and applies markers to select polygons which the user wants formed by specific masks. The user marks polygons to be included in a first photomask with a first color, and marks polygons to be included in a second photomask with a second color. These selections are fed into the multi-patterning decomposition tool, which assigns all of the polygons in the metal layer to one of two photomasks for patterning the metal layer. For example, the marked polygons can be assigned first, based on the user's pre-coloring information. The remaining polygons can be assigned to either photomask, so long as no multi-patterning conflicts (violations of minimum distance thresholds for either mask) result.

In some cases, the user may use this pre-coloring capability to try to group together patterns which would cause a multi-patterning conflict if assigned to the same mask, given the current layout. Further, the user may use the pre-coloring capability to try to separate patterns which would cause a multi-patterning conflict if assigned to different masks, given the current layout. To maximize multi-patterning design freedom, a method is described below enabling checking for pre-coloring a design layout. This method quickly identifies multi-patterning conflicts due to the user's pre-coloring of patterns and notifies the user. The user can modify the design (e.g., increase the spacing between two or more of the polygons, or re-route the path connecting two nodes) to eliminate the conflict, allowing the user to proceed with the user's selected pre-coloring choices.

In the examples below, reference is made to two-mask (double-patterning) techniques. These are only by way of example, and the concepts may be extended to multi-patterning systems employing more than two photomasks per multi-patterned (DPT)-layers. For example, active layer, inter-connect and metal layers are all examples of layers that can be patterned as DPT-layers using two or more photomasks. (This method is valid for all double-patterning layers, not only metal layers)

Figure 1B:
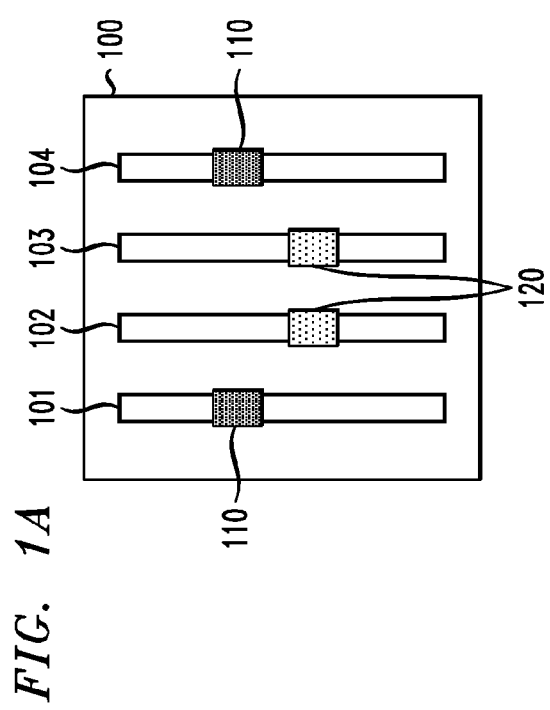
FIG. 1B shows the same layout with a different set of pre-coloring markers.
Figure 2:
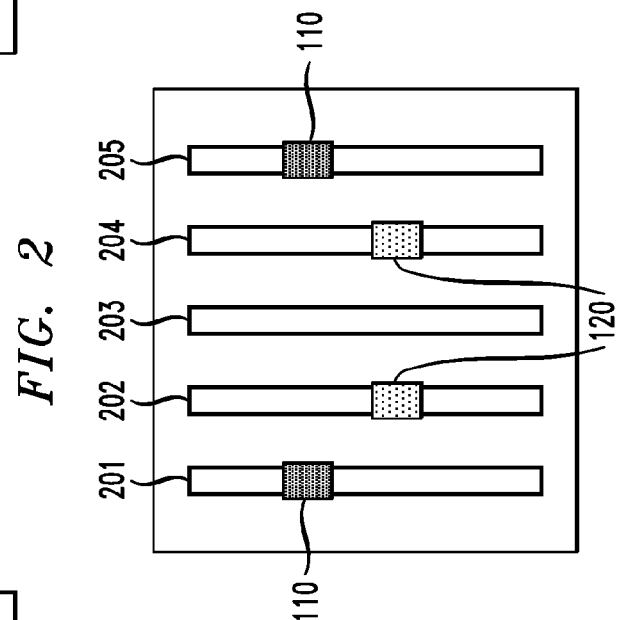
FIG. 2 is a schematic diagram of another layout of a metal layer with pre-coloring markers.

FIGS. 1 and 2 show simplified examples metal layer layouts 100, 200 having four polygons 101-104 and five polygons 201-205, respectively. Although FIG. 1A only shows four polygons 101-104, and FIG. 2 only shows five polygons 201-205, it will be understood that the metal layer may include any number of polygons. For purposes of the example, the spacing between each successive adjacent pair within the four polygons is assumed to be less than the minimum separator spacing for two patterns to be formed using the same photomask.

The markers 110, 120 may have a variety of formats. The markers may either be a shape, image or text. Markers which are shapes differ from each other in one or more visible characteristics, such as type of shape, color, size, pattern, or the like.

In FIG. 1A, the user has marked the four polygons with two types of markers 110, 120. The markers 110 indicate that polygons 101 and 104 should be formed on the first photomask for patterning the metal layer, and the markers 120 indicate that polygons 102 and 103 should be formed on the second photomask for patterning the metal layer. As stated above, the distance between each adjacent pair of polygons, including between polygons 102 and 103, is less than the minimum separator distance. Thus, in this simple example, it is readily discernible that polygons 102 and 103 in FIG. 1A cannot be formed by the same photomask. The layout 100 of FIG. 1A, with the pre-coloring selections as shown, has a multi-patterning conflict.

FIG. 1B shows the same layout 100, with only two pre-coloring markers 110. It is less easily discernible from a mere visual inspection, but this pre-coloring selection also creates a multi-patterning conflict. Assuming that the distance between each pair of adjacent polygons is less than the threshold minimum separator distance for forming patterns using a single mask, the multi-patterning decomposition would attempt to divide the patterns 101-104 between two masks, so that the distance between adjacent patterns on each individual mask is greater than the separator distance.

The minimum separator distance is derived from the wafer experiments. Polygons with a space less than the minimum separator distance will not be processed well, causing a small process window and inducing scum. Different DPT-layers may have different values of minimum separator distance. Different pattern types of the same layer have different minimum separator distances as well. For example, in 20 nm generation metal layer the minimum separator distance is about 100 nm for line-end pattern and 80 nm for line-edge-side pattern.

In the example of FIG. 1B, given that polygons 1 and 4 are to be located on a first mask, the polygons 2 and 3 cannot be assigned to the first and second masks in any combination that does not result in a double-patterning conflict. If polygon 2 is assigned to the first mask, then there is a conflict due to the distance between polygons 1 and 2 being less than the threshold minimum separator distance. If polygon 3 is assigned to the first mask, then there is a conflict due to the distance between polygons 3 and 4 being less than the threshold minimum separator distance. If polygons 2 and 3 are both assigned to the second mask, then there is a conflict due to the distance between polygons 2 and 3 being less than the threshold minimum separator distance. Thus, in this example, to achieve the desired pre-grouping of patterns 1 and 4, the user will need to change the layout (e.g., increase the distance between at least two of the polygons, or reroute one of the paths.). The user can then produce a conflict free layout, and proceed to fabrication of photomasks using the modified layout.

In FIG. 2, the user has marked four of the polygons with two types of markers 110, 120. The markers 110 indicate that polygons 201 and 205 should be formed on the first photomask for patterning the metal layer, and the markers 120 indicate that polygons 202 and 204 should be formed on the second photomask for patterning the metal layer. FIG. 2 is an example in which the pre-coloring selected by the user does not cause a conflict.

Other configurations of polygons are more complex than that shown in FIGS. 1 and 2, so that an individual evaluation of each possible assignment to check the pre-grouping selections would be time consuming. A method is described below to more quickly identify the presence of a multi-patterning conflict due to pre-grouping.

Figure 3:
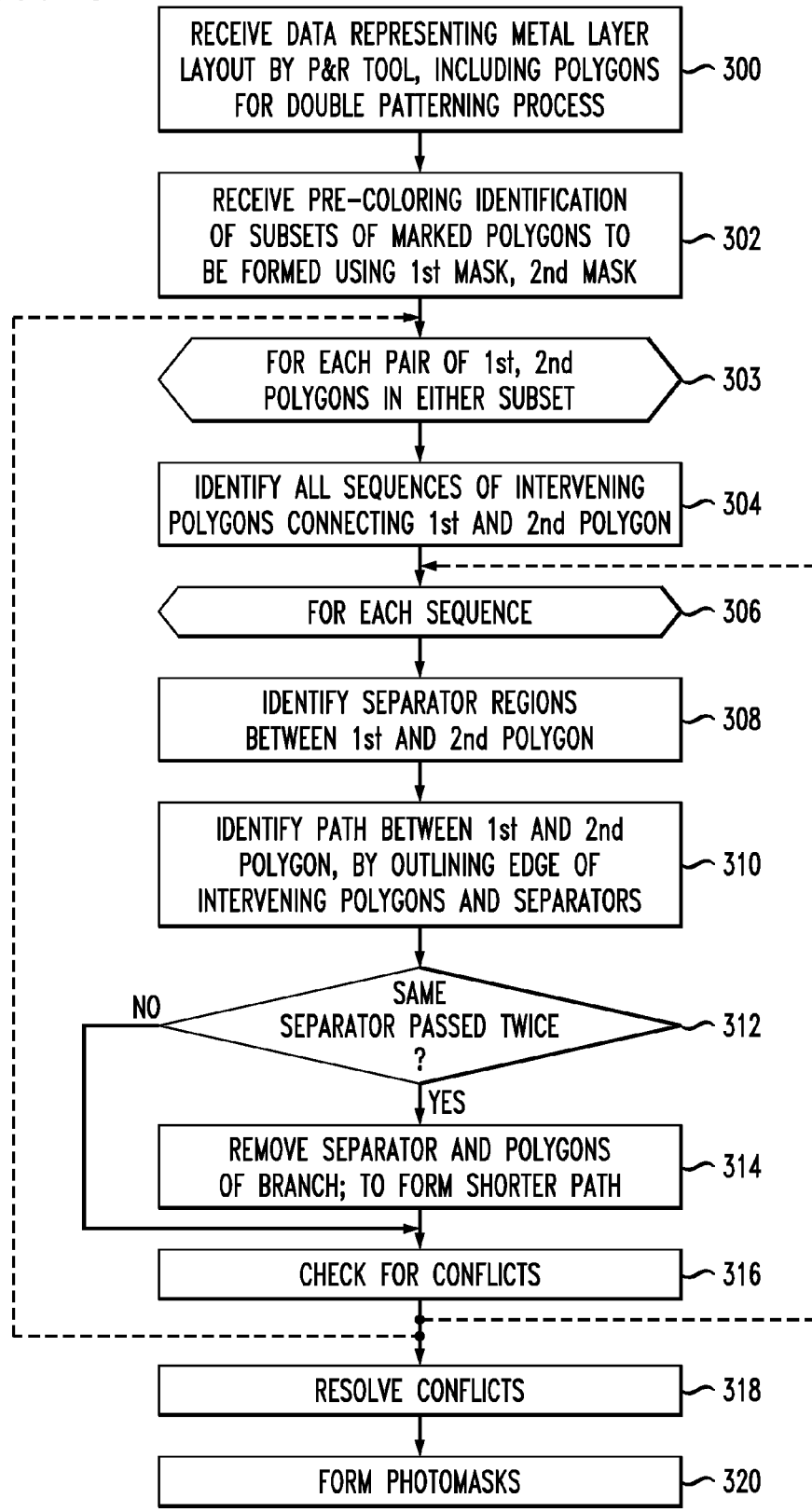
FIG. 3 is a flow chart of a method of finding the relevant path for determining multi-patterning conflicts.

In typical, more complex layouts, it becomes difficult to ascertain visually whether the user's pre-coloring causes a conflict. FIG. 3 is a flow chart of a method for automatically checking the user's pre-coloring selections before a complete double patterning (or multi-patterning) decomposition has been performed. The user can then modify the layout to resolve any conflicts before double patterning decomposition, so the double patterning decomposition provides a conflict free pair of masks.

At step 300 of FIG. 3, a set of data representing a metal layer layout are received from a place and route tool. The data include data representing polygons to be formed over a semiconductor substrate by a double patterning process.

At step 302, a set of pre-coloring selections are received from a user. The data identify a first subset of the polygons to be formed using the first photomask and a second subset of the polygons to be formed using the second photomask. Generally, the user should select at least two polygons for the pre-coloring to have any effect. The at least two polygons may be pre-colored to be on the same mask or on different masks. In most uses of the pre-coloring capability, the user selects at least one polygon for each respective mask. Nevertheless, the pre-coloring checking method and tool discussed herein performs checking effectively, regardless of how many polygons are selected for each mask by the user, and regardless of whether markers for both colors are used.

The processor may be programmed to display the layout of the metal layer, or a portion of the layout. The user is equipped with a palette having one or more markers, or the user can select a marker 110, 120 (FIGS. 1 and 2) from a menu and apply the marker to individual polygons by right-clicking on the polygons or pulling down a menu from a tools menu or application ribbon. The processor receives an identification of one or more polygons for each pre-coloring.

At step 303, a loop is performed for each pair of polygons marked by the user for inclusion in either mask. Thus, for every polygon having either marker 110 or 120 applied to it by the user, the loop is performed for that polygon in combination with each other polygon marked by the user.

At step 304, all sequences of intervening polygons connecting the first and second polygon in each pair are identified, where each intervening polygon is separated from its adjacent polygon by less than the minimum separator distance. Beginning with the first polygon of the pair, adjacent polygons less than the minimum separator distance from the first polygon are identified. Then the adjacent polygons less than the minimum separator distance from each of these polygons is identified. This is continued until one or more complete paths extending from the first polygon to the second polygon are identified. The result is one or more sequences of polygons connecting the first and second polygons.

Figure 5:
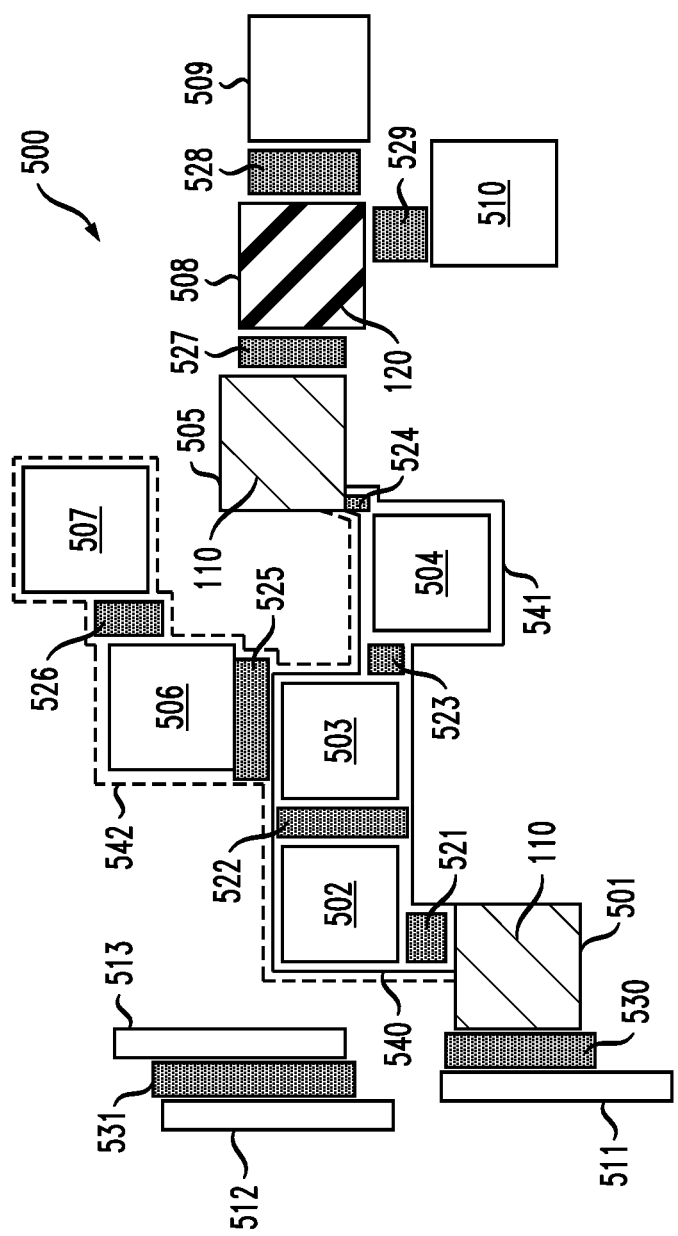
FIG. 5 is a diagram of method of finding the paths on a metal layer with pre-coloring markers.

For example, FIG. 5 is a diagram showing a metal layer 500 having a set of polygons 501-513. The user has placed the first marker 110 (indicated by rising cross hatching) on polygons 501 and 505, and the second marker 120 (indicated by falling cross hatching) on polygon 508. Also shown in FIG. 5 are a plurality of separators 521-531 between adjacent polygons that are separated from each other by less than the minimum separator distance for patterning the metal layer 500 with a single photomask. The separators 521-531 are not patterned on the substrate, but are shown in FIG. 5 to demonstrate the concept separator concept. In some embodiments, the separators 521-531 are displayed on a computer display along with the polygons 501-513 to assist the user. Thus, the presence of any separator bars indicates that the entire layout cannot be patterned using a single photomask.

In FIG. 5, during execution of step 304, the sequences of polygons between polygon 501 and polygon 505 are identified. In this case, two sequences of polygons are identified from the layout. The first sequence includes intervening polygons 502-504 between the two marked end polygons 501, 505. The second sequence includes polygons 502, 503, 506, 507, 506, 503 and 504, where polygons 506 and 503 are crossed twice in the sequence. In determining the sequences, polygons that are separated by at least the minimum separator distance are not considered. Thus, polygons 512 and 513 are not considered, because they are both separated from all of the polygons 501-507 by at least the minimum separator distance (even though polygons 512 and 513 are not separated from each other by the minimum separator distance). Also, polygons that lie past either of the marked polygons 501 and 505 (i.e., polygons 508-511) are not considered even if they are separated from polygons 501 or 505 by less than the minimum separator distance.

At step 306, the loop from step 308 to 316 is performed for each of the sequences of polygons identified in step 304.

At step 308, the separator regions between each pair of polygons in the sequence is determined. The first sequence, including polygons and separators is 501, 521, 502, 522, 503, 523, 504, 524 and 505. The second sequence, including polygons and separators is 501, 521, 502, 522, 503, 525, 506, 526, 507, 526, 506, 525, 503, 523, 504, 524 and 505.

At step 310, each path between the first and second marked polygons 501 and 505 is identified, by outlining the edges of the intervening polygons and separators. The path travels along the outside of a polygon that would be formed by merging all of the polygons in the sequence and the intervening separators into one polygon and outlining it. In this example, the first sequence 501, 521, 502, 522, 503, 523, 504, 524 and 505 has two paths 540 above the polygons, and 541 below the polygons. These two paths 540 and 541 are equivalent, in that each path borders the exact same set of polygons and separators. The other sequence 501, 521, 502, 522, 503, 525, 506, 526, 507, 526, 506, 525, 503, 523, 504, 524 and 505 is bordered by path 542, shown in phantom.

If there is no complete path formed between the pair of marked polygons, this indicates that there is at least one separation between two of the intervening polygons (or between one of the two polygons and its adjacent intervening polygon) that is greater than or equal to the minimum separator distance. In this case, the selection of these two polygons does not cause a multi-patterning conflict.

At step 312, each path is evaluated to determine whether the path passes any of the separators twice, indicating that the sequence has an extra branch. If the result is "yes," step 314 is performed next. Otherwise, step 316 is performed next. In the example of FIG. 5, the path 542 passes separators 525 and 526 twice. This indicates that the sequence 501, 521, 502, 522, 503, 525, 506, 526, 507, 526, 506, 525, 503, 523, 504, 524 and 505 has an extra branch.

At step 314, the separators and polygons that are passed twice along the path, and any polygon only adjacent to a separator that is passed twice are removed from the sequence to form a shorter path. In the example of path 542, the separators 525 and 526 and the polygons 506 and 507 are removed. The resulting shorter path is the same as the path 540 previously identified in step 310. Thus, the path 540 is identified as the appropriate path to check for multi-patterning conflicts in the next step.

At step 316, the automated check for conflicts is performed for the identified shorter path, from which any branches have been removed at step 314. This step is described in detail in the discussion of FIG. 4.

In this example, the paths 540 and 541 are equivalent to each other, because they both border the same sequence of polygons and separator regions. Also, after the unnecessary branch is removed from path 542, that path also has the same polygons and separators as path 540. Thus, step 316 would yield the same result for all three paths, and the automated check may be performed only once. Also, the path from 540 to 541 would be encountered again when checking all of the sequences for the polygon 541.

However, in other scenarios, there may be two independent sequences of polygons between the pair of marked polygons, each independent sequence having a respective independent path. Two paths are independent if: fewer than all of the polygons and separators in the first path are included in the second path, AND fewer than all of the polygons and separators in the second path are included in the first path. If there are two or more independent paths, all the independent paths are checked separately, and may yield different results. (One path may be conflict free, and the other path may cause a multi-patterning conflict).

In some embodiments, the full loop of steps 308-316 is performed for every sequence, regardless of whether the sequence has the same polygons and separators as a previously checked sequence.

In other alternative embodiments, a check is made to determine whether a sequence is the same as a previously checked sequence before performing step 316. So, for example, if path 540 is checked once in step 316, then path 541 (which has the same sequence of polygons and separators) would not be checked, since the result is known to be the same.

The loop of steps 308 to 316 is repeated for each remaining sequence.

The loop of steps 304 to 316 is repeated for each remaining pair of polygons. During two subsequent iterations of the loop, the pair of marked polygons 501 and 508 are checked similarly, and the pair of marked polygons 505 and 508 is checked similarly. For brevity the details of repeating the loop for these pairs of polygons is not set forth in detail.

At step 318, the designer or foundry resolves any multi-patterning conflicts. If the designer wants to maintain the designated pre-coloring selections, the designer makes a layout change, for example. The change may include increasing the distance between two of the polygons in the sequence, or rerouting a polygon or sequence of polygons. Thus a modified layout is provided from the layout by increasing a distance between two of the plurality of polygons connected by the connections in the path, to a distance greater than the minimum threshold distance, or by rerouting one or more polygons.

Once step 318 is completed for every found multi-patterning conflict, the entire checking process from step 300 to step 316 can be repeated to confirm that a conflict-free layout has been achieved.

At step 320, a set of photomasks is formed for multi-patterning, based on the modified layout.

Figure 4:
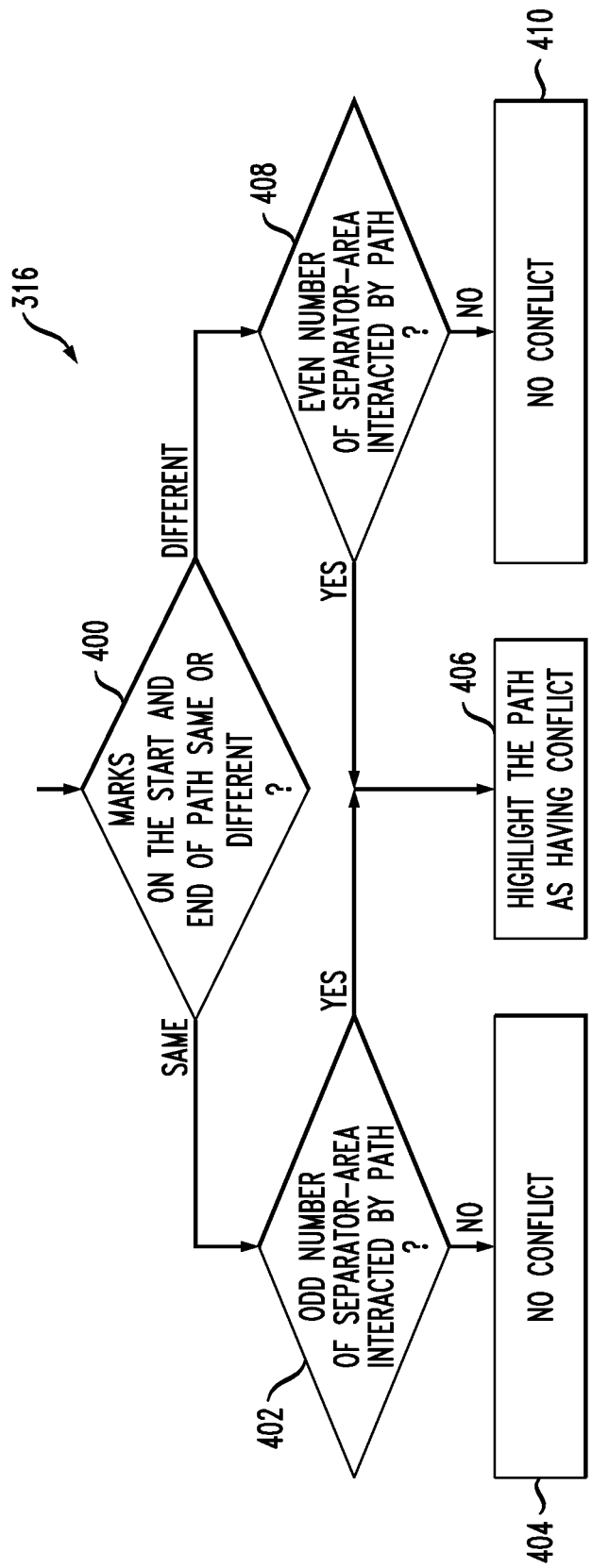
FIG. 4 is a flow chart of the method of checking the path determined in FIG. 3

FIG. 4 shows details of step 316.

At step 400, having found the relevant shorter paths to check for multi-patterning conflict, a determination is made whether the pair of polygons 501, 505 have the same marker or a different marker. If the marks are the same, step 402 is performed. If the marks are different, step 408 is performed. In the example of FIG. 5, both polygons 501 and 505 have the same marker 110, indicating that they are to be placed on the same photomask as each other, so step 402 is performed next.

At step 402, a determination is made whether the number of separators bordered by the path is odd. If the number of separators is odd (and the polygons 501, 505 have the same marker), step 406 is performed next. if the number is even, step 404 is performed next.

At step 404, when the pair of polygons 501, 505 both have the same marker and the number of separators (521, 522, 523, 524) in the path is even, there is no multi-patterning conflict caused by this pair of polygons 501, 505. Thus, a simple count of the separators in the relevant path completes the multi-patterning check for this case. It is again noted that this determination is made before any of the patterns 502-504, 506, 507, or 509-513 have been assigned to particular photomasks. In this example, a final assignment of all polygons may show, for example, polygons 501, 503 and 505 assigned to the first photomask and polygons 502 and 504 assigned to the second photomask.

At step 408, if the marks are different from each other, and there is an even number of separators along the path, then step 406 is executed next.

At step 410, if the marks are different from each other and there is an odd number of separators along the path, then there is no conflict.

At step 406, if there is an odd number of separators and the marks on the two polygons are the same (or if there is an even number of separators and the marks on the two polygons are different), then the path is highlighted as having a multi-patterning conflict. This may be displayed or output in a variety of text and/or graphical formats. In some embodiments, the two marked polygons 501, 505 and all intervening polygons are highlighted in a different color. In some embodiments, the path adjacent the intervening polygons and separators is highlighted.

Figure 6:
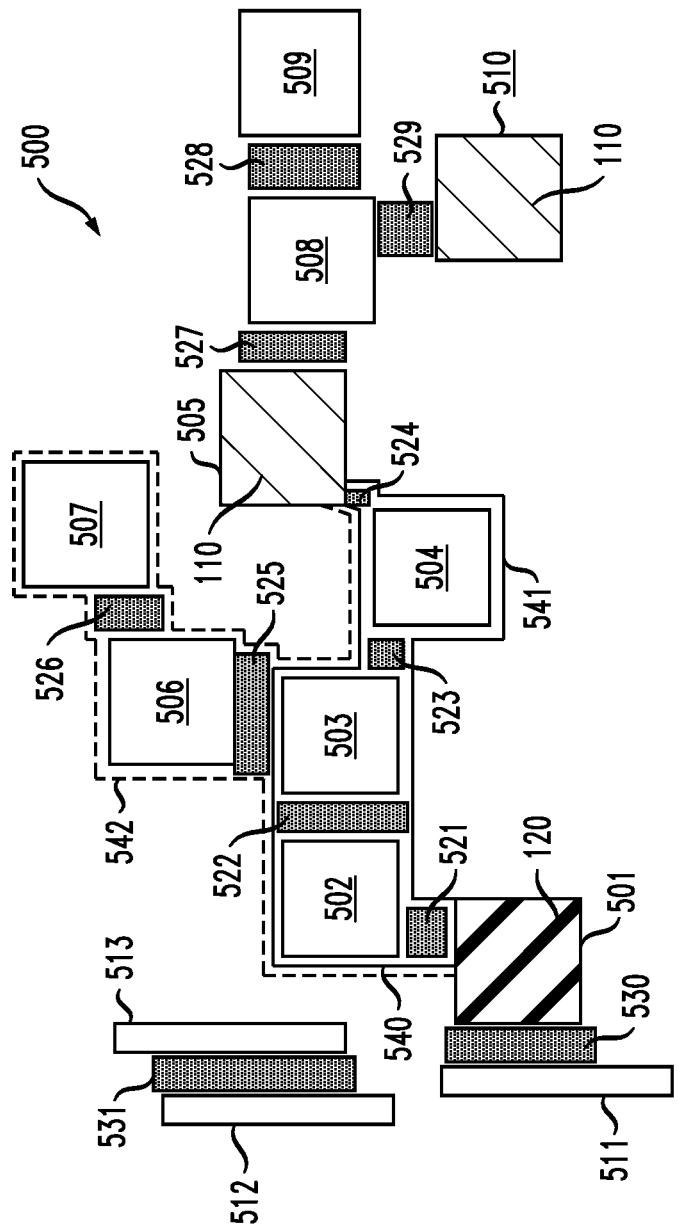
FIG. 6 is a diagram of method of finding the paths on the metal layer of FIG. 5, with different pre-coloring markers applied.

FIG. 6 is another example, in which the same layout 500 shown in FIG. 5 is presented. In FIG. 6, the user has marked polygon 501 with the second marker 120, and polygons 505 and 510 are marked with the second marker.

When the method of FIG. 3 is performed using the marks shown in FIG. 6, the steps from 304 to 314 identify the same paths with respect to the pair of polygons 501, 505, as these steps are independent of whether the marks are same or different. However, upon execution of step 316 (shown in detail in FIG. 4), the marks on polygons 501 and 505 are different, so step 408 is performed.

At step 408, since there is an even number of separators, then step 406 is performed.

At step 406, a conflict is highlighted.

Figure 7:
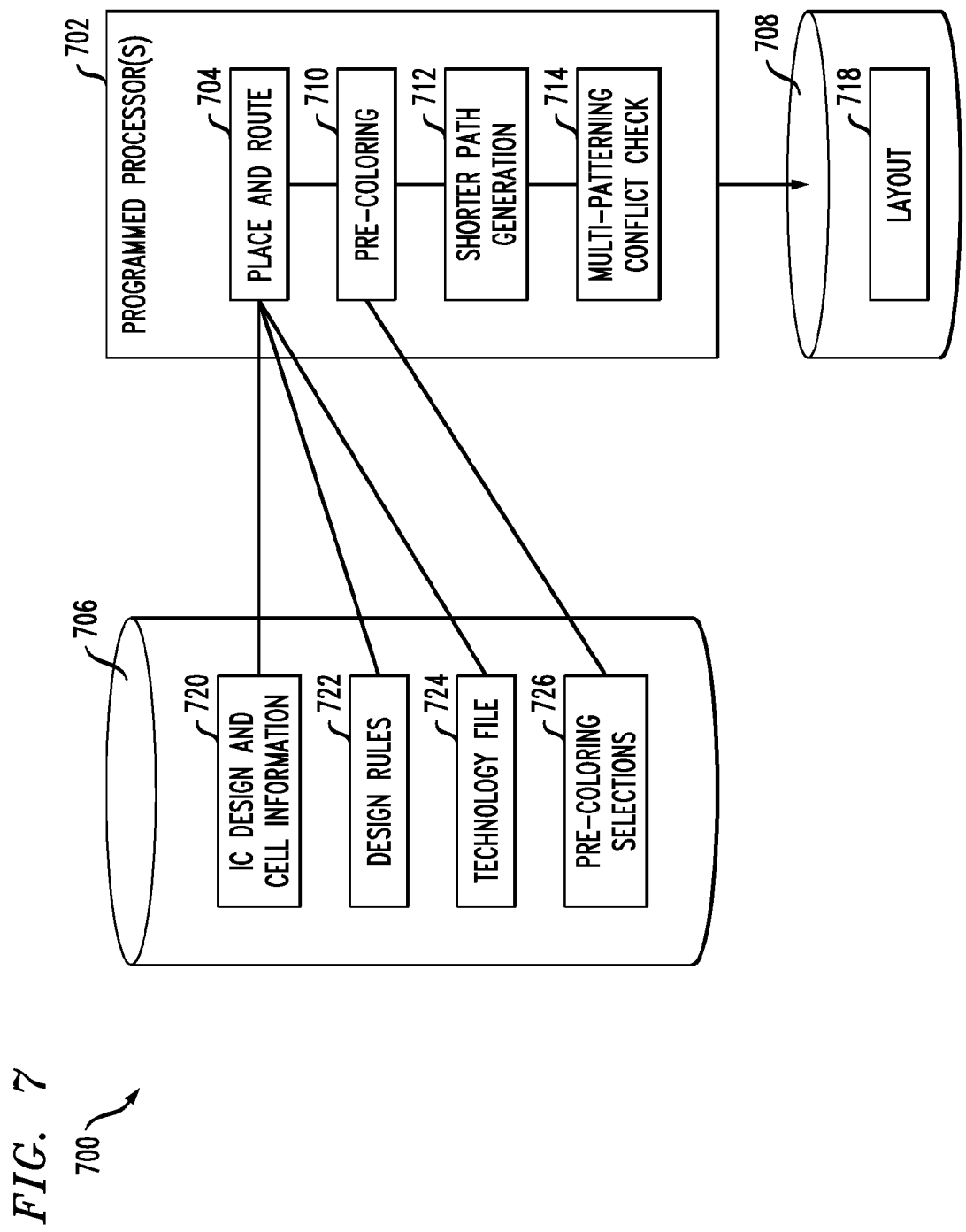
FIG. 7 is a block diagram of a system for performing the multi-patterning conflict checks.

FIG. 7 is a block diagram of a system for multi-patterning conflict checking, according to one embodiment. Block 702 indicates that one or more programmed processors may be included. In some embodiments, the processing load is performed by two or more application programs, each operating on a separate processor. In other embodiments, the processes are all performed using one processor. Similarly, two media 706 and 708 are shown, but the data may be stored in any number of media. Although FIG. 7 shows an allocation of the various tasks to specific modules, this is only one example. The various tasks may be assigned to different modules to improve performance, or improve the ease of programming.

System 700 includes an electronic design automation ("EDA") tool 702 such as "IC COMPILER"™, sold by Synopsis, Inc. of Mountain View, Calif., which may include a place and route tool 704, such as "ZROUTE"™, also sold by Synopsis. Other EDA tools 702 may be used, such as the "VIRTUOSO" custom design platform or the Cadence "ENCOUNTER"® digital IC design platform may be used, along with the "VIRTUOSO" chip assembly router 704, all sold by Cadence Design Systems, Inc. of San Jose, Calif.

EDA tool 702 is a special purpose computer formed by retrieving stored program instructions from a non-transient computer readable storage medium 706, 708 and executing the instructions on a general purpose processor (not shown). Examples of non-transient computer readable storage mediums 706, 708 include, but are not limited to, read only memories ("ROMs"), random access memories ("RAMs"), flash memories, or the like. Tangible, non-transient machine readable storage mediums 706, 708 are configured to store data generated by the place and route tool 704.

Place and route tool 704 is capable of receiving an identification of a plurality of cells to be included in an integrated circuit ("IC") or interposer layout, including a list 720 of pairs of cells within the plurality of cells to be connected to each other. The place and route tool 704 places the cells from the IP library and lays out the connecting patterns. The place and route tool 704 may be equipped with a set of default design rules 722 and technology file 724.

The pre-grouping selection modules 730 display the layout of a metal layer that is to be decomposed into two or more masks for multi-patterning. The module 730 provides the user tools for selecting groups of patterns, such that the user can mark individual polygons with two types of markers indicating that patterns marked by the first marker must be on the first photomask and patterns marked by the second marker must be formed on the second photomask.

The multi-patterning conflict check module 712 constructs the paths between each pair of polygons selected for pre-coloring. The relevant distances between adjacent patterns throughout the layout is determined, and the separator distances are identified. For each pair of pre-colored polygons, the module 714 determines whether the polygons have the same marker or different marker, and whether the number of separator regions along the path is odd or even. Based on these two pieces of data, the module 714 can determine whether it is possible to form two masks using the current layout without any multi-patterning conflicts. This analysis can be completed before the double patterning decomposition is actually performed.

In some embodiments, a method comprises: (a) receiving data representing a layout of a metal layer of an integrated circuit generated by a place and route tool, the layout including a plurality of polygons to be formed in the metal layer by a multi-patterning process; (b) receiving an identification of a first one of the plurality of polygons that is to be formed using a first photomask and a second one of the plurality of polygons that is to be formed using a second photomask; (c) identifying any intervening polygons of the plurality of polygons along a first path connecting the first polygon to the second polygon, and separator regions between adjacent polygons along the first path, the separator regions having sizes less than a minimum threshold distance between polygons formed on the first photomask; (d) counting the separator regions; and (e) identifying a multi-patterning conflict if the count of separator regions is even, prior to assigning all remaining ones of the plurality of polygons to the first or second masks.

In some embodiments, a system comprises at least one machine readable storage medium having a first storage portion for storing data representing a layout of a metal layer of an integrated circuit generated by a place and route tool, the layout including a plurality of polygons to be formed in the metal layer by a multi-patterning process. The storage medium has a second storage portion for storing an identification of a first one of the plurality of polygons that is to be formed using a first photomask and a second one of the plurality of polygons that is to be formed using a second photomask. A processor is coupled to the storage medium and configured for performing the steps of: identifying any intervening polygons of the plurality of polygons along a first path connecting the first polygon to the second polygon, and separator regions between adjacent polygons along the first path, the separator regions having sizes less than a minimum threshold distance between polygons formed on the first photomask; counting the separator regions; and identifying a multi-patterning conflict if the count of separator regions is even, prior to assigning all remaining ones of the plurality of polygons to the first or second masks.

In some embodiments, a tangible, persistent machine readable storage medium is encoded with computer program code, such that, when the computer program code is executed by a processor, the processor performs a method comprising: (a) receiving data representing a layout of a metal layer of an integrated circuit generated by a place and route tool, the layout including a plurality of polygons to be formed in the metal layer by a multi-patterning process; (b) receiving an identification of a first one of the plurality of polygons that is to be formed using a first photomask and a second one of the plurality of polygons that is to be formed using a second photomask; (c) identifying any intervening polygons of the plurality of polygons along a first path connecting the first polygon to the second polygon, and separator regions between adjacent polygons along the first path; (d) counting the separator regions; and (e) identifying a multi-patterning conflict if the count of separator regions is even, prior to assigning all remaining ones of the plurality of polygons to the first or second masks.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, when the computer program code is loaded into and executed by a computer, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
   (a) receiving data representing a layout of a multi-patterned layer (DPT-layer) of an integrated circuit generated by a computer implemented place and route tool, the layout including a plurality of polygons to be formed in the DPT-layer by a multi-patterning process;
   (b) receiving an identification of a first polygon within the plurality of polygons and a second polygon within the plurality of polygons, where the first and second polygons are both to be formed using a single first photomask;
   (c) identifying any intervening polygons of the plurality of polygons along a first path connecting the first polygon to the second polygon, and separator regions between adjacent polygons along the first path;
   (d) counting the separator regions; and
   (e) identifying a multi-patterning conflict if the count of separator regions along the first path is odd, prior to assigning all remaining ones of the plurality of polygons to the first photomask or to a second photomask to be used in the multi-patterning process.

2. The method of claim 1, further comprising:
   (f) receiving at least one identification of a third polygon that is to be formed using a different one of the first or second photomasks from the photomask to be used to form the first and second polygons;
   (g) identifying any intervening polygons of the plurality of polygons along a second path connecting the first polygon with the third polygon, and any separator regions between adjacent polygons along the second path;
   (h) counting the separator regions along the second path; and
   (i) identifying a multi-patterning conflict if the count of separator regions along the second path is even, prior to assigning all remaining ones of the plurality of polygons to the first or second masks.

3. The method of claim 2, further comprising:
   forming the first photomask for patterning the DPT-layer by the multi-patterning process using a modified layout, wherein the modified layout is provided from the layout in response to the identification of the multi-patterning conflict in step (i), by increasing a distance between two of the polygons along the second path, to a distance greater than the minimum threshold distance, or by adding or removing one polygon along the second path.

4. The method of claim 1, further comprising:
   forming the first and second photomasks for patterning the DPT-layer by the multi-patterning process using a modified layout, wherein the modified layout is provided from the layout in response to the identification of the multi-patterning conflict in step (e), by increasing a distance between two of the polygons along the first path, to a distance greater than the minimum threshold distance, or by adding or removing one polygon along the first path.

5. The method of claim 1, wherein step (c) includes:
identifying each sequence including the first and second polygons and any adjacent polygons between the first and second polygons;
for each sequence, identifying a respective separator region between each successive pair of the adjacent polygons in the sequence that are separated from each other by less than the minimum threshold distance; and
for each sequence, identifying a respective path connecting the first and second polygons, the path extending around at least one side of each intervening polygon and each separator region in the sequence.

6. The method of claim 5, wherein the step of identifying a multi-patterning conflict comprises:
for each sequence, identifying a multi-patterning conflict if a count of separator regions along the respective path is odd.

7. The method of claim 5, further comprising:
for each sequence, determining if the respective path has a branch; and
for each sequence having a branch, removing the branch from the sequence before performing step (d).

8. The method of claim 7, wherein the determining step includes determining whether the path extends past one of the separator regions two separate times and extends past at least one of the plurality of polygons between the first time the path extends around that one separator region and the second time the path extends past that one separator region.

9. The method of claim 8, wherein the removing step includes removing from the sequence:
the one separator region, and
any polygon or separator region past which the path extends between the first time the path extends past that one separator region and the second time the path extends past that one separator region.

10. A system comprising:
at least one machine readable storage medium having a first storage portion for storing data representing a layout of a multi-patterned layer (DPT-layer) of an integrated circuit generated by a place and route tool, the layout including a plurality of polygons to be formed in the DPT-layer by a multi-patterning process using at least a first photomask and a second photomask;
the storage medium having a second storage portion for storing an identification of a first polygon and a second polygon of the plurality of polygons, where the first and second polygons are both to be formed using the same one of the first or second photomasks; and
a processor coupled to the storage medium and configured for performing the steps of:
identifying any intervening polygons of the plurality of polygons along a first path connecting the first polygon to the second polygon, and separator regions between adjacent polygons along the first path, the separator regions having sizes less than a minimum threshold distance between polygons formed on the first photomask;
counting the separator regions; and
identifying a multi-patterning conflict if the count of separator regions is odd, prior to assigning all remaining ones of the plurality of polygons to the first or second masks.

11. The system of claim 10, wherein:
the storage medium has a third storage portion for storing at least one identification of a third polygon that is to be formed using a different one of the first or second photomasks from the photomask to be used to form the first and second polygons; and
the processor is further configured for performing the steps of:
identifying any intervening polygons of the plurality of polygons along a second path connecting the first polygon with the third polygon, and any separator regions between adjacent polygons along the second path;
counting the separator regions along the second path; and
identifying a multi-patterning conflict if the count of separator regions along the second path is even, prior to assigning all remaining ones of the plurality of polygons to the first or second masks 12. The system of claim 10, wherein the step of identifying intervening polygons along the first path includes:
identifying each sequence including the first and second polygons and any adjacent polygons between the first and second polygons;
for each sequence, identifying a respective separator region between each successive pair of the adjacent polygons in the sequence that are separated from each other by less than the minimum threshold distance; and
for each sequence, identifying a respective path connecting the first and second polygons, the path extending around at least one side of each intervening polygon and each separator region in the sequence.

13. The system of claim 12, wherein the step of identifying a multi-patterning conflict includes, for each sequence, identifying a multi-patterning conflict if a count of separator regions along the respective path is odd.

14. The system of claim 12, further comprising:
for each sequence, determining whether the path extends past one of the separator regions two separate times and extends past at least one of the plurality of polygons between the first time the path extends around that one separator region and the second time the path extends past that one separator region; and
for each sequence having a branch, before performing step (d), removing from the sequence:
the one separator region, and
any polygon or separator region past which the path extends between the first time the path extends past that one separator region and the second time the path extends past that one separator region.

15. A method comprising:
(a) receiving data representing a layout of a multi-patterned layer (DPT-layer) of an integrated circuit generated by a computer implemented place and route tool, the layout including a plurality of polygons to be formed in the DPT-layer by a multi-patterning process;
(b) receiving an identification of a first polygon within the plurality of polygons, to be formed using a first photomask;
(c) identifying polygons within the plurality of polygons along a first path containing the first polygon, and separator regions between adjacent polygons along the first path;

(d) counting the separator regions; and (e) identifying a multi-patterning conflict if the count of separator regions along the first path is odd, prior to assigning all remaining ones of the plurality of polygons to the first photomask or to a second photomask to be used in the multi-patterning process.

16. The method of claim 15, further comprising:

(f) receiving at least one identification of a second polygon that is to be formed using a different one of the first or second photomasks from the photomask to be used to form the first polygon;

(g) identifying any intervening polygons of the plurality of polygons along a second path connecting the first polygon with the second polygon, and any separator regions between adjacent polygons along the second path;

(h) counting the separator regions along the second path; and (i) identifying a multi-patterning conflict if the count of separator regions along the second path is even, prior to assigning all remaining ones of the plurality of polygons to the first or second masks.

17. The method of claim 15, wherein step (c) includes:

identifying each sequence including the first polygon and a second polygon and any adjacent polygons between the first and second polygons;

for each sequence, identifying a respective separator region between each successive pair of the adjacent polygons in the sequence that are separated from each other by less than the minimum threshold distance; and for each sequence, identifying a respective path connecting the first and second polygons, the path extending around at least one side of each intervening polygon and each separator region in the sequence.

18. The method of claim 17, wherein the step of identifying a multi-patterning conflict comprises::

for each sequence, identifying a multi-patterning conflict if a count of separator regions along the respective path is odd.

19. The method of claim 17, further comprising:

for each sequence, determining if the respective path has a branch; and for each sequence having a branch, removing the branch from the sequence before performing step (d).

20. The method of claim 19, wherein:

the determining step includes determining whether the path extends past one of the separator regions two separate times and extends past at least one of the plurality of polygons between the first time the path extends around that one separator region and the second time the path extends past that one separator region;

the removing step includes, for each sequence, determining whether the path extends past one of the separator regions two separate times and extends past at least one of the plurality of polygons between the first time the path extends around that one separator region and the second time the path extends past that one separator region; and for each sequence having a branch, before performing step (d), removing from the sequence:

the one separator region, and any polygon or separator region past which the path extends between the first time the path extends past that one separator region and the second time the path extends past that one separator region.

* * * * *